United States Patent [19]

Lau

[11] Patent Number: 4,874,317

[45] Date of Patent: Oct. 17, 1989

[54] JACKFIELD WITH FRONT TERMINALS

[75] Inventor: Frederick L. Lau, Skokie, Ill.

[73] Assignee: Switchcraft, Inc., Chicago, Ill.

[21] Appl. No.: 232,358

[22] Filed: Aug. 15, 1988

[51] Int. Cl.[4] .......................... H01R 9/09; H05K 7/10

[52] U.S. Cl. .......................................... 439/54; 439/61; 439/377

[58] Field of Search .................................... 439/59–62, 439/64, 79, 80, 78–83, 668, 669, 629, 630, 350–358, 377, 54

[56] References Cited

U.S. PATENT DOCUMENTS

| | | | |
|---|---|---|---|
| 3,177,404 | 4/1965 | Patmore | 317/99 |
| 3,351,894 | 11/1967 | Kinkaid | 437/79 |
| 3,536,870 | 10/1970 | Izumi | 439/668 |
| 4,002,381 | 1/1977 | Wagner et al. | 312/183 |
| 4,134,631 | 1/1979 | Conrad et al. | 339/17 M |
| 4,401,351 | 8/1983 | Record | 339/17 LM |
| 4,439,809 | 3/1984 | Weight et al. | 361/220 |
| 4,585,285 | 4/1986 | Martens | 439/62 |
| 4,602,829 | 7/1986 | De Andrea | 312/320 |
| 4,655,535 | 4/1987 | Kysiak | 339/182 R |
| 4,693,531 | 9/1987 | Raphal et al. | 439/680 |
| 4,768,961 | 9/1988 | Lau | 439/61 |
| 4,772,562 | 9/1988 | Lau | 439/368 |

OTHER PUBLICATIONS

Japan OPI-UM Appln., 28892/78, Hitachi, 3-1978.

Switchcraft, Inc. Brochure "tini-telephone" and Standard Patching Systems & Components.

*Primary Examiner*—Neil Abrams

*Attorney, Agent, or Firm*—John T. Meaney; William R. Clark; Richard M. Sharkansky

[57] ABSTRACT

A channelized jackfield comprising a housing having therein a linear array of juxtaposed channels wherein respective assemblies of aligned printed circuit boards and connecting slab-like modules are slidably inserted edgewise from the front of the housing. Each of the assemblies includes an inverted L-shaped bracket of dielectric material having a vertical leg latchingly secured to a front edge portion of the printed circuit board and provided with a plurality of spaced notches through which respective terminal lugs extend insulatingly from the printed circuit board and externally of the housing. Also, each of the L-shaped brackets has a leg disposed substantially orthogonal to the vertical leg and carries on its upper surface a guide groove for slidably receiving the connecting module and guiding it into mating engagement with an aligned connector attached to the front edge portion of the printed circuit board. When the assemblies are fully inserted into the juxtaposed channels, the vertical legs of the inverted L-shaped brackets disposed in side-by-side relationship form a portion of a front faceplate for the jackfield.

3 Claims, 2 Drawing Sheets

JACKFIELD WITH FRONT TERMINALS

BACKGROUND OF THE INVENTION

1. Field of the Invention

This invention relates generally to electrical jackfields and is concerned more particularly with an electrical jackfield having a linear array of juxtaposed jack modules and respective aligned printed circuit boards which are frontally removable from the jackfield.

2. Discussion of the Prior Art

A jackfield assembly may comprise a housing having therein a linear array of electrical jack modules which are disposed in side-by-side relationship along a front portion of the housing to have respective plug-receiving end portions extend through a front panel of the housing. In a U.S. patent application, Ser. No. 20,938, filed on Mar. 2, 1987, there is disclosed a channelized jackfield having a housing wherein a plurality of substantially planar channels extend in juxtaposed relationship from a front portion to an opposing rear portion of the housing. Each of the channels has inserted therein, through a front opening of the housing, a respective tri-jack module with a slab-like body having a narrow side uppermost in the housing. Also, each of the channels has inserted therein, through a rear opening of the housing, a respective printed circuit board which is disposed on edge within the housing.

Each of the tri-jack modules has a plug-receiving end portion comprising a vertically extending front plate having protruding therefrom a vertical series of three mutually spaced sleeves which extend through a front panel covering the front opening of the housing. In each of the modules there is a stacked array of three electrical jacks, each of which is aligned with a respective sleeve extending through the front plate of the module. Each of the electrical jacks comprises a plurality of electrical switches having respective moveable leaf spring members electrically engageable with respective stationary members. Also, the moveable members of an electrical jack are disposed for actuation by a patch cord end plug inserted through the aligned sleeve. The end plug has mutually insulated portions shaped for electrically contacting respective moveable members of the electrical jack.

The moveable members and the stationary members of the electrical switches comprising the three electrical jacks stacked in each module are attached to respective terminals which extend in a linear array from a rear portion of the module adjacent the aligned printed circuit board. The terminals in the linear array extend into electrical engagement with respective contacts of a connector secured to the adjacent end portion of the printed circuit board. Contacts of the connector are electrically connected through respective conductors of the printed circuit board to respective terminal lugs which extend from an opposing end portion of the printed circuit board. The terminal lugs project out of the rear opening of the housing for electrical connection, as by wirewrapping, for example, to respective conductors of an umbilical wire harness.

In U.S. Pat. No. 4,772,562 there is disclosed a channelized jackfield similar to the described jackfield but having a split front panel. The split front panel provides means for inserting or removing an individual jack module and the aligned printed circuit board as a unitary subassembly from the front of the housing without disturbing the patch cord connections between the other modules of the linear array. However, this embodiment has the drawback that all of the terminal lugs extending from the printed circuit boards project out of the rear of the housing. The housing may be mounted in a tier of racks which extends linearly over a considerable distance, such as thirty feet, for example. As a result, if a testing technician wishes to connect a wire to or disconnect a wire from a terminal lug when inserting a patch cord end plug into a sleeve of a jack module, the terminal lugs are not readily accessible from the front of the jackfield assembly. Consequently, the testing operation usually requires two technicians, one technician at the rear of the rack for connecting or disconnecting the wires and the other technician at the front of the rack for inserting the patch cord end plug or with drawing it from the sleeve of a jack module.

SUMMARY OF THE INVENTION

These and other disadvantages of the prior art are overcome by this invention providing a channelized jackfield with a housing having a front opening including a lower portion filled with a linear array of juxtaposed vertical legs of respective dielectric L-shaped brackets. The vertical legs extend integrally downward from adjacent end portions of respective orthogonal legs of the brackets which project forwardly of the housing in juxtaposed relationship with one another. Also, each of the vertical legs has a width defining the width of an aligned planar channel extending into the housing to a rear wall thereof.

The vertical legs of the L-shaped brackets are secured to adjacent end portions of respective printed circuit boards slidably disposed on edge in the respectively aligned channels. Each of the vertical legs of the dielectric brackets has disposed therein a vertical series of mutually spaced slots through which respective terminal lugs extend outwardly from the front of the housing. The terminal lugs are connected electrically through respective conductors of the printed circuit board to respective contacts of a connector secured to an adjacent end portion of the board above the vertical leg of the L-shaped bracket.

Each of the forwardly projecting, orthogonal legs of the brackets has an upper surface provided with a collinear groove wherein a side rail portion of a respective tri-jack module is slidably disposed. The tri-jack module has protruding from an inner end portion thereof a linear series of mutually spaced terminals which extend into electrical engagement with respective contacts of the connector secured to the adjacent end portion of the printed circuit. Thus, some of the module terminals are connected through the engaged contacts of the connector and connecting conductors of the printed circuit board to respective terminal lugs extending outwardly from the front of the housing below the module. Accordingly, these terminal lugs are readily accessible to a testing technician inserting patch cord end plugs into jack sleeves of the module.

BRIEF DESCRIPTION OF THE DRAWINGS

For a better understanding of the disclosed invention, reference is made in the following detailed description to the accompanying drawings wherein.

DESCRIPTION OF THE PREFERRED EMBODIMENT

Figure 1:
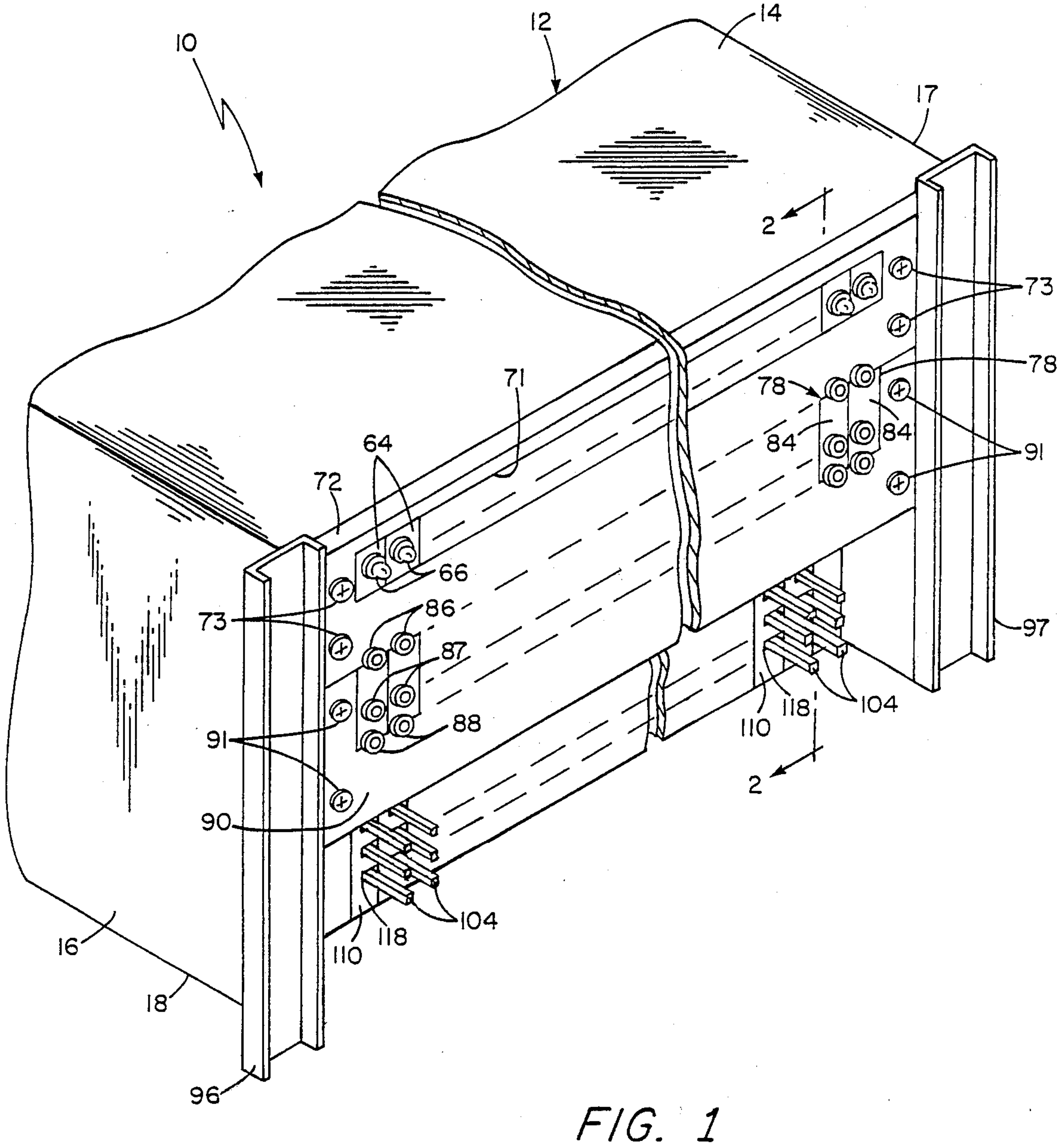
FIG. 1 is an isometric view of the jackfield assembly embodying the invention.
Figure 2:
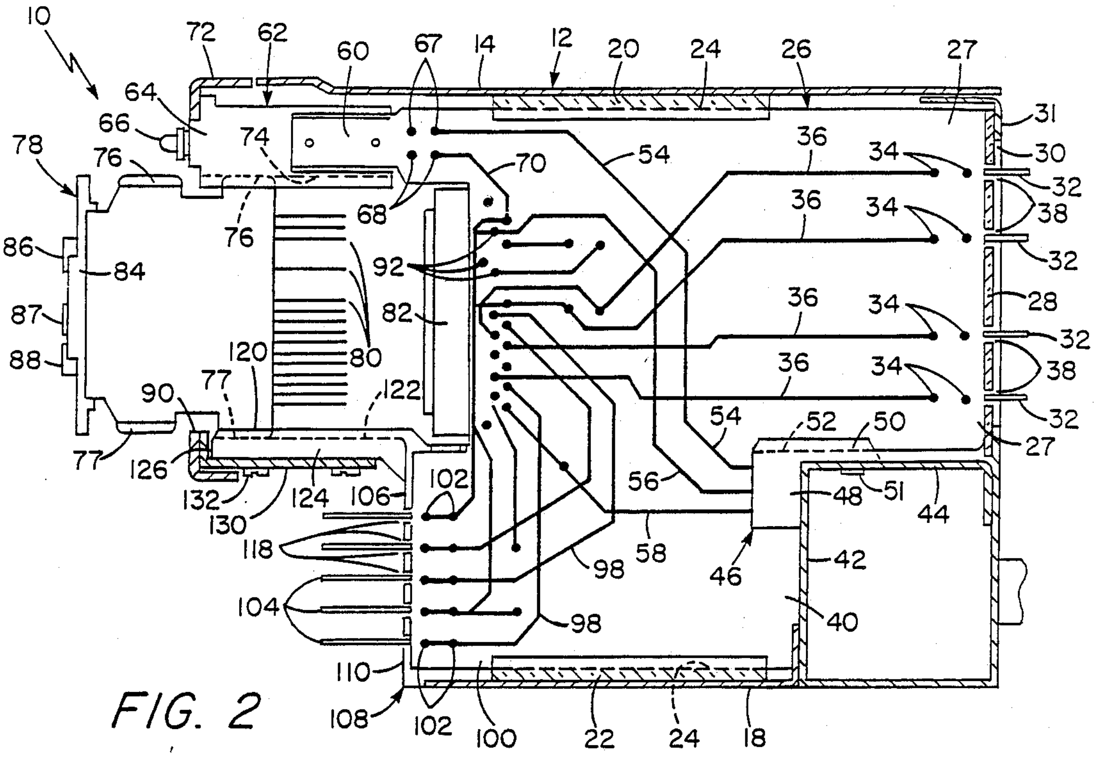
FIG. 2 is a cross-sectional view taken along the line 2—2 shown in FIG. 1 and looking in the direction of the arrows.

Referring to the drawings wherein like characters of reference designate like parts, there is shown in FIGS. 1 and 2 a channelized jackfield assembly 10 comprising a sheet metal housing 12 made of electrically conductive material, such as anodized aluminum, for example. Housing 12 includes a top wall 14 integrally joined to respective opposing side walls 16 and 17 which are fixedly attached, as by welding, for example, to a bottom wall 18 of the housing. Within housing 12, there is attached, as by rivets, for example, to the top wall 14 and the bottom wall 18 respective plank-like, wafer guides 20 and 22 which extend laterally from adjacent the side wall 16 to adjacent the opposing side wall 17 of housing 12. Wafer guides 20 and 22 are made of dielectric material, such as molded plastic material, for example, and are fully disclosed in the aforementioned U.S. Pat. No. 4,772,362 which is incorporated by reference herein.

The wafer guides 20 and 22 are disposed in aligned opposing relationship with one another and have facing surfaces provided with respective linear series of laterally spaced grooves or channels 24 which extend forwardly and rearwardly of the housing 12 in substantially parallel relationship with one another. Corresponding channels 24 in the respective wafer guides 20 and 22 are disposed in registration with one another for slidably receiving therein opposing side edge portions of respective printed circuit boards 26 which are inserted from the front of housing 12. The printed circuit boards 26 have respective rear end portions 27 which abut a dielectric rear wall portion 28 supported along an elongated opening 30 in a metallic rear wall 31 of housing 12. Extending rearwardly from the rear end portion 27 of printed circuit boards 26 are respective vertical arrays of mutually spaced terminal lugs 32 made of rigid electrically conductive material, such as tin plated brass, for example. Each of the terminal lugs 32 has a proximal end portion electrically connected, as by soldering, for example, to an aligned pair of eyelets 34 in the adjacent rear end portion 27 for electrical connection to a respective connecting conductor 36 of the supporting board 26. Also, each of the terminal lugs 32 has a distal end portion passed through an aligned aperture 38 in the dielectric rear wall portion 28 of housing 12 for electrical connection, as by wire-wrapping, for example, to a respective external conductor (not shown).

The printed circuit boards 26 have lower side portions including rear shoulder portions 40 which abut a vertical partition 42 of housing 12. Partition 42 has an upper end portion integrally joined to an orthogonal, rearwardly extending partition 44 of housing 12. The respective partitions 42 and 44 extend laterally from adjacent the side wall 16 to adjacent the opposing side wall 17 of housing 12. Vertical partition 42 has a lower marginal portion attached, as by welding, for example, to an adjacent edge portion of bottom wall 18. The rearwardly extending partition 44 has a rear edge portion similarly attached to a portion of rear wall 31 adjacent the lower edge of opening 30. Supported on inner surface portions of the respective partitions 42 and 44 adjacent the integral juncture thereof is a right angle, buss housing 46 which extends laterally from adjacent side wall 16 to adjacent the opposing side wall 17 of housing 12. Structural details of the buss housing 46 are more fully disclosed in the aforementioned U.S. Pat. No. 4,772,562.

Buss housing 46 includes a connector portion 48 which extends along the vertical partition 42 of housing 12 and a plank-like portion 50 which is attached, as by rivets 51, for example, to the rearwardly extending partition 44 of housing 12. The plank-like portion 50 is similar to the wafer guides 20 and 22, respectively, and has disposed in its upper surface a linear array of laterally spaced channels 52 which extend forwardly and rearwardly of housing 12. Each of the channels 52 is aligned with a respective pair of opposing channels 24 in the respective wafer guides 20 and 22 for slidably receiving an aligned edge portion of the inserted printed circuit board 26. Also, each of the printed circuit boards 26 has inserted into the right-angled connector portion 48 of buss housing 46 an aligned portion whereon respective buss conductors 54, 56 and 58 have terminal end portions disposed in vertically spaced relationship with one another. As a result, the printed circuit boards 26 have their respective buss conductors 54 connected electrically to a negative forty-eight volt source, their respective buss conductors 56 connected to system ground and their respective buss conductors 58 connected to signal ground.

The buss conductors 54 of the respective boards 26 are routed to forward neck end portions 60 of the printed circuit boards which have secured thereto respective forwardly extending, lamp jack housings 62 made of dielectric material. Structural details of the lamp jack housings 62 are more fully disclosed in the aforementioned U.S. Pat. No. 4,772,562. The lamp jack housings 62 have forward end portions terminating in respective block-like rims 64 which define openings of respective sockets (not shown) wherein respective lamps 66 are installed. Each of the lamps 66 has a pair of laterally spaced terminal conductors (not shown) inserted into electrical engagement with respective aligned contacts (not shown) in the receiving housing 62 for electrical connection of respective pairs of aligned eyelets 67 and 68 in the neck end portions 60 of the supporting board 26. The pairs of aligned eyelets 67 in the respective boards 26 are connected electrically to the respective buss conductors 54 thereof; and the pair of aligned eyelets 68 are connected electrically to respective conductors 70 of the printed circuit boards 26. The respective block-like rims 64, as shown more clearly in FIG. 1, extend in juxtaposed relationship with one another through an elongated rectangular opening 71 in an upper front panel 72 of the jackfield assembly 10. Upper front panel 72 is secured to the housing 12 by readily removable fastening means, such as screws 73, for example.

Each of the lamp jack housings 62 has a lower side surface wherein a collinear channel 74 is disposed for slidably receiving an aligned pair of rails 76 which project upwardly from a slab-like body of a tri-jack module 78 having a narrow side uppermost. Each of the tri-jack modules 78 has extending rearwardly from an inner end of its slab-like body a vertical array of mutually spaced terminals 80. The terminals 80 of each module 78 are slidably inserted into electrical engagement an aligned connector 82. Structural details of the tri-jack modules 78 and the respective aligned connectors 82 are more fully disclosed in the aforementioned U.S. patent application, Ser. No. 106,202, and the aforementioned U.S. patent application, Ser. No. 20,983, which is incorporated by reference herein.

Each of the modules 78 has a forward end portion terminating in a forwardly projected landing 84 which extends laterally between three vertically spaced sleeves 86, 87 and 88, respectively. The sleeves 86, 87 and 88 extend forwardly of the respective landings 84 from within the slab-like bodies of the respective modules 78. Landings 84 of the respective modules, as shown in FIG. 1, extend in juxtaposed relationship with one another between respective opposing edge portions of the upper front panel 72 and an intermediate front panel 90. The three vertically spaced sleeves 86, 87 and 88 of each module 78 are disposed between opposing semi-circular notches (not shown) in respective aligned edge portions of the upper front panel 72 and the intermediate front panel 90. Front panel 90 is secured to the housing 12 by readily removable fastening means, such as screws 91, which are similar to the screws 73, for example. Thus, the upper front panel 72 and the intermediate front panel 90 constitute a split front panel means which is readily removable for permitting tri-jack modules 78 to be removed from or inserted into electrical engagement with an aligned connector 82 from the front of housing 12.

Within the slab-like bodies of the respective modules 78, the sleeves 86, 87 and 88 are aligned with respective electrical jacks (not shown), each of which comprises a stacked plurality of moveable switch members engageable electrically with respective stationary switch members (not shown). The moveable switch members of each electrical jack (not shown) are actuated by a conventional jack plug (not shown) inserted through the aligned sleeve from the front of jackfield assembly 10. Also, the moveable switch members (not shown) and the stationary switch members (not shown) in the slab-like body of each module 78 are connected electrically to respective terminals 80 extending rearwardly thereof. The terminals 80 of each module 78 are connected electrically through respective contacts of the aligned connector 82 to respective eyelets 92 disposed in adjacent central portion of the supporting board 26. Some of the eyelets 92 are connected electrically to respective printed circuit conductors 36 which are connected electrically through respective eyelets 34 to respective terminal lugs 32 extending rearwardly out of housing 12. Thus, the respective modules 78 have some of their switch members, such as the moveable switch members (not shown), for example, connected electrically to the terminal lugs 32 extending out of the rear of jackfield assembly 10.

As shown in FIG. 1, there is attached to opposing side walls 16 and 17 of housing 12 respective mounting brackets 96 and 97 which are intended for installing the jackfield assembly 10 in a tier of racks (not shown) which may extend linearly for a considerable distance. Consequently, the terminal lugs 32 protruding from the rear of jackfield assembly 10 may not be readily accessible to a testing technician inserting test jack plugs into the sleeves 86, 87 and 88 protruding from the front of jackfield assembly 10. Therefore, it would be desirable to have some or all of the terminal lugs of the respective boards 26 accessible at the front of the jackfield assembly 10 for any changes in connecting wiring that may be required during testing. However, it also would be desirable to have the capability of removing through the front of jackfield assembly 10 anyone of the channel defining subassemblies comprising a respective printed circuit board 26 having secured thereto a respective lamp jack housing 62 and a respective module 78 if still installed.

Accordingly, these and other problems are solved by this inventive embodiment having at least some of the eyelets 92, such as those connected to respective stationary switch members (not shown) of the aligned modules 78, for example, connected electrically to respective printed circuit conductors 98 which are routed to lower forward end portions 100 of the respective boards 26. In the lower forward end portions 100, the conductors 98 are electrically connected to respective forwardly extending pairs of aligned eyelets 102 which are disposed adjacent lower forward edges of the respective boards 26. The pairs of eyelets 102 of each printed circuit board 26 are laterally spaced apart and have attached thereto proximal end portions of respective terminal lugs 104 which have opposing distal end portions extended forwardly of the adjacent forward edge of the respective board 26. Thus, the printed circuit boards 26 are disposed vertically in housing 12 have extended from respective lower forward end portions thereof respective vertical arrays of laterally spaced terminal lugs 104.

Figure 3:
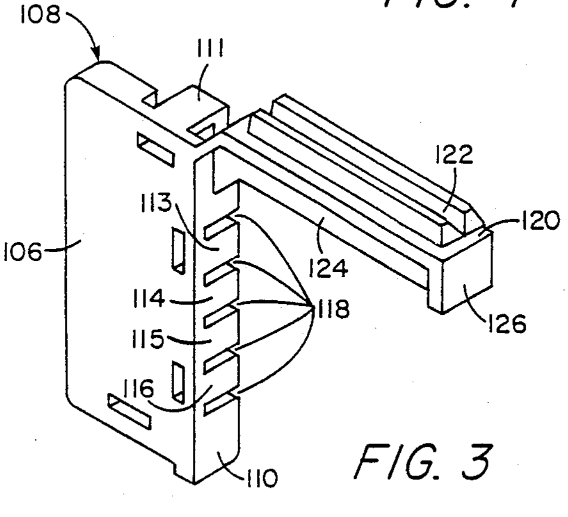
FIG. 3 is an isometric view of the L-shaped bracket shown in FIG. 2.

As shown in FIG. 3, each of the boards 26 has the proximal end portions of its respective terminal lugs 104 disposed between a covered surface of its lower forward end portion 100 and a covering plate-like portion 106 of a respective L-shaped bracket 108. Each of the brackets 108 is made of dielectric material, such as molded plastic material, for example, and has protruding integrally from the surface of its plate-like portion 106 adjacent the respective board 26 a pair of mutually spaced pins 109. The pins 109 are press fitted into respectively aligned holes (not shown) which extend through the thickness of the respective board 26.

Figure 5:
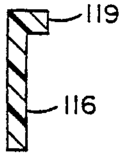
FIG. 5 is a cross-sectional view taken along the line 5—5 shown in FIG. 4.

Also, each of the vertical plate-like portions 106 has extended integrally from its upper and lower edges and beyond the thickness of the respective board 26 mutually aligned, flexible fingers 111 and 112, respectively. The fingers 111 and 112 have distal end portions provided with ramp-like sloped surfaces terminating in respective abrupt shoulders which lockingly engage the exposed surface of the lower forward end portion 100 of the respective board 26. Moreover, each of the plate-like portions 106 has a forward edge from which an integral vertical wall 110 extends beyond the thickness of the respective board 26 and has disposed therein a vertical array of transverse slots 118 which are open-ended. The slots 118 extend from the distal edge of wall 110 and are spaced apart by interposed flexible fingers 113, 114, 115 and 116, respectively. The fingers 113 and 116, as shown in FIG. 5, have distal end portions provided with respective right-angle shoulders 119 which lockingly engage the exposed surface of the lower forward end portion 100 of the respective board 26.

Thus, when the pins 109 extending from the plate-like portion 106 of each bracket 108 are press-fitted into the respective aligned holes in the lower forward end portion 100 of the respective board 26, the edges of the portion 100 cause the respective fingers 111, 112, 113 and 116 to flex backward and return for locking engagement with the exposed surface of the lower forward end portion 100. Simultaneously, the terminal lugs 104 extending forwardly of the lower forward end portion 100 are inserted laterally into respectively aligned slots 118 in the vertical wall 110 of the respective bracket 108. Consequently, as shown in FIG. 1, the vertical walls 110 of the respective brackets 108 are disposed in juxtaposed relationship with one another to constitute a lower portion of the front faceplate of jackfield assembly 10.

Figure 4:
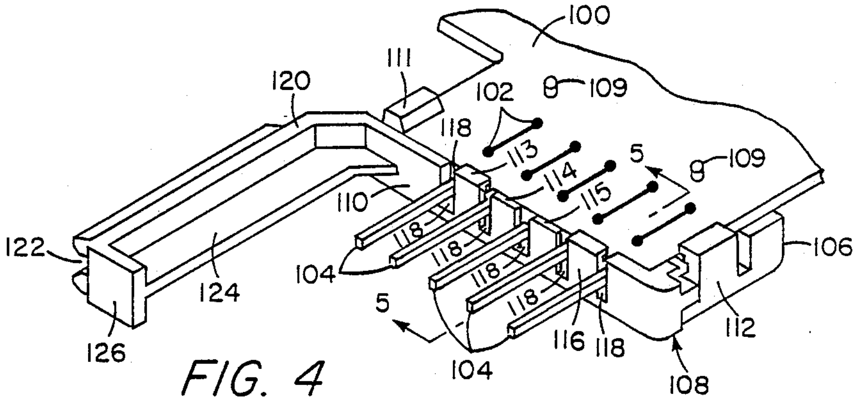
FIG. 4 is an isometric view of the bracket shown in FIG. 3 and secured to the printed circuit board shown in FIG. 2.

As shown in FIGS. 3 and 4, the vertical wall 110 of each bracket 108 has an upper end portion integrally joined to a forwardly extending leg 120 which comprises an orthogonal extension of the respective vertical wall 110. Each of the legs 120 has an upper surface provided with an integral plateau portion wherein a collinear channel 122 is disposed for slidably receiving a pair of aligned rails 77 projecting downwardly from a lower side surface of a respective coplanar module 78. Also, each of the legs 120 has depending integrally from its lower surface a collinear rib 124 which has an end portion integrally joined to the respective forward wall 110. Distal end portions of the legs 120 and the depending ribs 124 are integrally joined to forward end caps 126 of the respective brackets 108.

As shown more clearly in FIG. 2, there is disposed against the juxtaposed end caps 126 of the respective brackets 108 a forward portion of a right-angled support plate 130 which a lower portion disposed beneath the ribs 124 of the respective brackets 108. The support plate 130 is secured to the housing 12 by readily removable fastening means, such as screws 132, for example. Thus, when the respective front panels 72 and 90 are removed from housing 12 and the support plate 130 is removed therefrom any one of the channel-defining subassemblies comprised of a respective printed circuit board 26, the attached lamp jack housing 62 and the aligned module 78 may be slidably removed through the front of jackfield assembly 10.

Thus, there has been disclosed herein a jackfield assembly having a housing provided with front faceplate comprised of an upper portion wherein there is disposed a linear array of juxtaposed electrical jack modules and comprised of a lower portion wherein there is disposed a linear array of juxtaposed L-shaped brackets having vertical legs from which protrude respective vertical arrays of mutually spaced terminals. Each of the vertical arrays of mutually spaced terminals is disposed in registration with a respective module having protruding therefrom a vertical series of plug receiving sleeves with aligned switch members electrically connected to respective terminals of the vertical array. Accordingly, the terminals of the vertical arrays are readily accessible to a test technician inserting jack plugs into the sleeves of the modules.

From the foregoing, it will be apparent that all of the objectives have been achieved by the structures and methods described herein. It also will be apparent, however, that various changes may be made by those skilled in the art without departing from the spirit of the inventive subject matter, as expressed in the appended claims. It is to be understood, therefore, that all matter shown and described is to be interpreted as illustrative and not in a limiting sense.

What is claimed is:

1. A printed circuit board assembly comprising:

a printed circuit board having an edge with a right angle connector adapted for receiving and removably mating with an electrical jack module, said printing circuit board having a plurality of printed circuit conductors with respective end portions disposed in spaced relationship with one another at a portion of said edge adjacent to said right angle connector;

a linear array of laterally spaced terminals disposed along said portion of said edge, each of said terminals having a proximal end portion connected electrically to a respective one of said end portions of said conductors and having a distal end portion projected outwardly of said edge of said board; and a dielectrical bracket having a first leg disposed along said portion of said edge and being secured to said board, said bracket having an orthogonal second leg integrally joined to an end portion of said first leg and projected outwardly of said edge of said board, said first leg of said bracket having disposed therein a linear array of mutually spaced apertures through which respective distal end portions of said terminals extend, said orthogonal second leg of said bracket having a collinear surface provided with a channel adapted for receiving said electrical jack module in sliding engagement.

2. An electrical jackfield comprising:

a housing having a front opening extended laterally between a vertical pair of opposing side walls of the housing, said front opening having an upper portion and a lower portion;

a linear array of juxtaposed jack modules having respective slab-like bodies slidably disposed in said upper portion of said front opening, each of said slab-like bodies having a narrow side uppermost and having a front end provided with a forwardly protruding, vertical series of plug-receiving sleeves;

a linear array of dielectric brackets having respective vertical legs slidably supported in side-by-side relationship with one another in said lower portion of said front opening, each of said vertical legs having protruding forwardly therefrom a vertical series of mutually spaced terminals wherein each of said vertical legs is disposed in registration with a respective one of said modules in said upper portion of said front opening;

said housing including upper faceplate means for closing said upper portion of said front opening; and said linear array of dielectric brackets comprising a lower faceplate means for closing said lower portion of said front opening wherein said lower faceplate means is recessed with respect to said upper faceplate means said dielectric brackets include respective orthogonal legs extended integrally forward from upper end portions of said vertical legs of said dielectric brackets wherein each of said orthogonal legs has an upper surface provided with a collinear channel means for slidably receiving therein a lower side portion of the respective module disposed in registration with said vertical leg of the respective dielectric bracket.

3. An electrical jackfield comprising:

a housing having a rear portion and having an opposing front portion with a front opening extended laterally between a vertical pair of opposing side walls of said housing, said front opening having an upper portion and a lower portions;

a linear array of laterally spaced printed circuit boards extended from said rear portion to said front portion of said housing, each of said printed circuit boards being slidably insertable on a longitudinal edge thereof into said housing through said front opening and having a plurality of conductors with first end portions spaced apart in an upper front end portion of said board aligned with said upper portion of said front opening, said conductors having respective second end portions spaced apart in a lower forward end portion adjacent a forward edge portion thereof aligned with said lower portion of said front opening;

a linear array of juxtaposed jack modules having respective slab-like bodies slidably disposed with respective narrow sides uppermost in said upper portion of said front opening, each of said slab-like bodies being aligned with a respective one of said printed circuit boards and having a rear end from which a vertical series of terminals extends into electrical connecting relationship with a respective one of said first end portions of said conductors; and a linear array of dielectric brackets having respective vertical legs slidably supported in side-by-side relationship with one another in said lower portion of said front opening, each said vertical legs being secured to said lower forward end portion of a respective one of said boards and having projected forwardly therefrom a vertical series of mutually spaced terminal lugs with proximal end portions connected electrically with a respective one of said second end portions of said conductors.

* * * * *